United States Patent [19]

Kaihara et al.

[11] Patent Number: 5,130,932
[45] Date of Patent: Jul. 14, 1992

[54] GENERATING DEVICE FOR PRODUCTION SYSTEM SIMULATOR

[75] Inventors: Toshiya Kaihara; Keiji Takeuchi; Hiroshi Imai, all of Hyogo, Japan

[73] Assignee: Mitsubishi Denki Kabushiki Kaisha, Tokyo, Japan

[21] Appl. No.: 483,845

[22] Filed: Feb. 23, 1990

[30] Foreign Application Priority Data

Mar. 3, 1989 [JP] Japan .................................. 1-52263

[51] Int. Cl.$^5$ .............................................. G06F 15/20
[52] U.S. Cl. ..................................... 364/468; 264/578
[58] Field of Search ............... 364/468, 474.19, 474.24, 364/513, 578

[56] References Cited

U.S. PATENT DOCUMENTS

| | | | |
|---|---|---|---|
| 4,887,218 | 12/1989 | Natarajan | 364/468 |
| 4,901,242 | 2/1990 | Kotan | 364/468 |
| 5,016,204 | 5/1991 | Simoudis | 364/578 |

OTHER PUBLICATIONS

S. Fujii, "FMS Design and System Simulator", Preceeding of Japan Society of Mechanical Engineers, vol. 86, No. 779, pp. 1206–1210, Oct. 1983.

K. K. Musselman et al., "Applying Simulation to Assembly Line Design", IFS Ltd., UK, pp. 21–34, 1986.

*Primary Examiner*—Joseph Ruggiero
*Assistant Examiner*—Paul Gordon
*Attorney, Agent, or Firm*—Rothwell, Figg, Ernst & Kurz

[57] ABSTRACT

In a generating device for a production system simulator according to the present invention, interactive parameter input using graphic symbols is made possible by a production system model input section, and also the automatic creation of the production system simulator is made possible by a simulator generating section, so that even those people who know nothing about a general purpose simulation language are able to perform the generating work of the production system suimulator effectively in a short time. Furthermore, since the production system simulator which is automatically generated is written in the general purpose simulation language and is editable, an expert in simulation can generate a higher grade production system simulator in a short time by adding a function or functions to meet characteristics inherent in each production system besides the fundamental simulator functions generated by the present device.

2 Claims, 7 Drawing Sheets

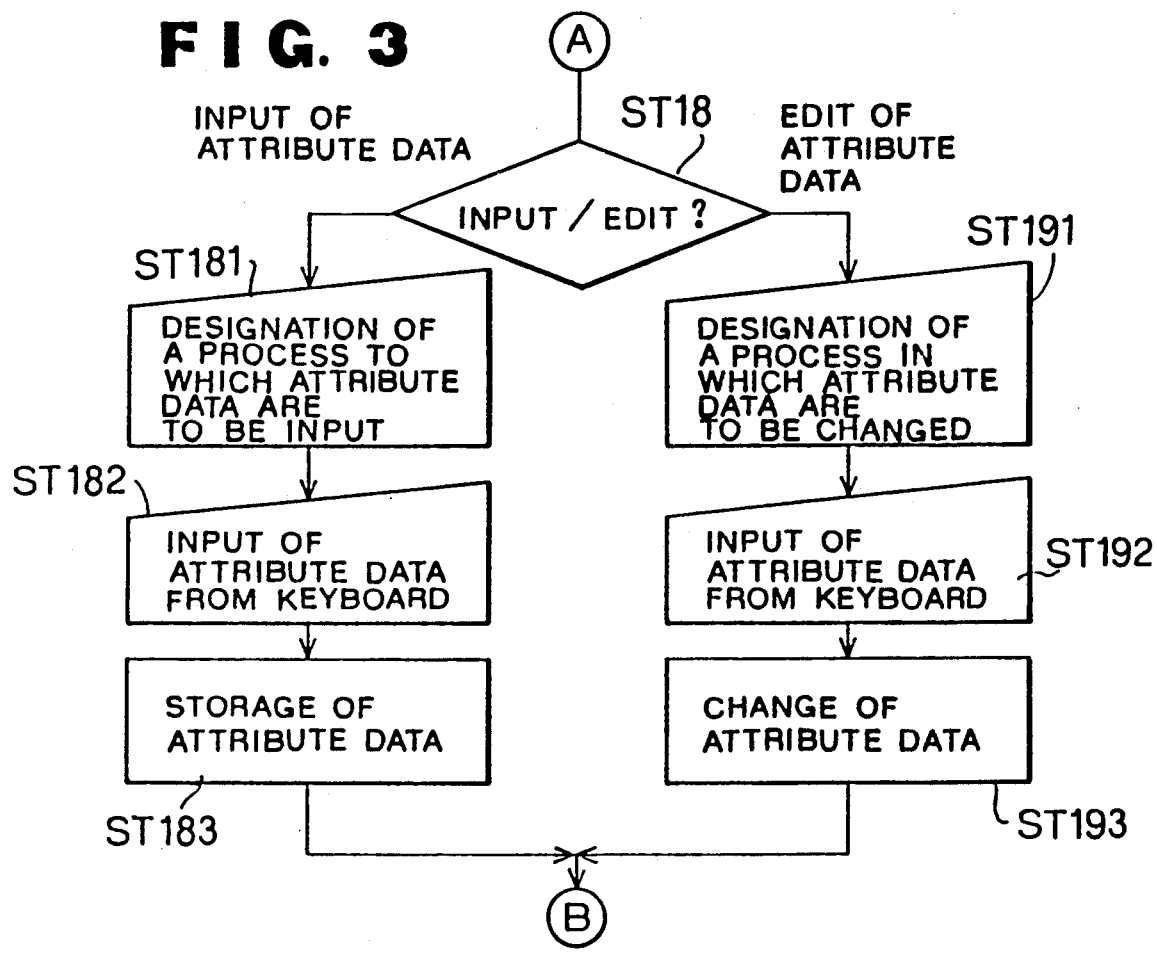
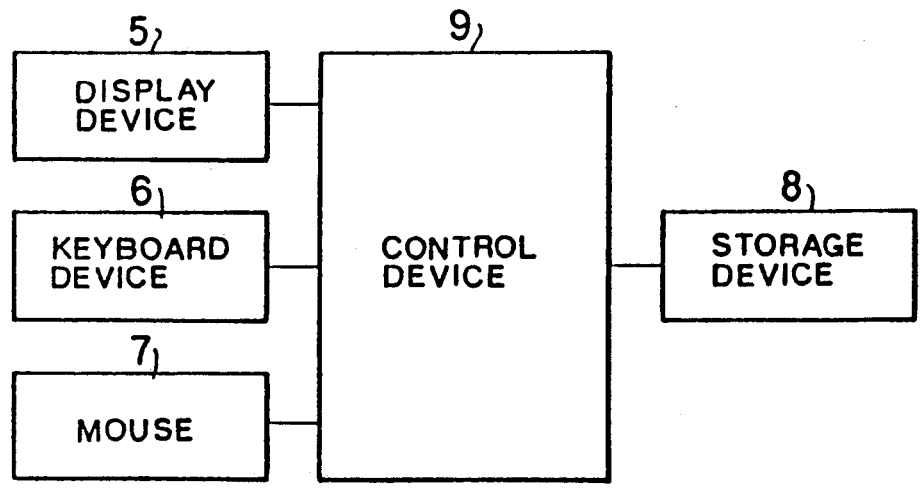

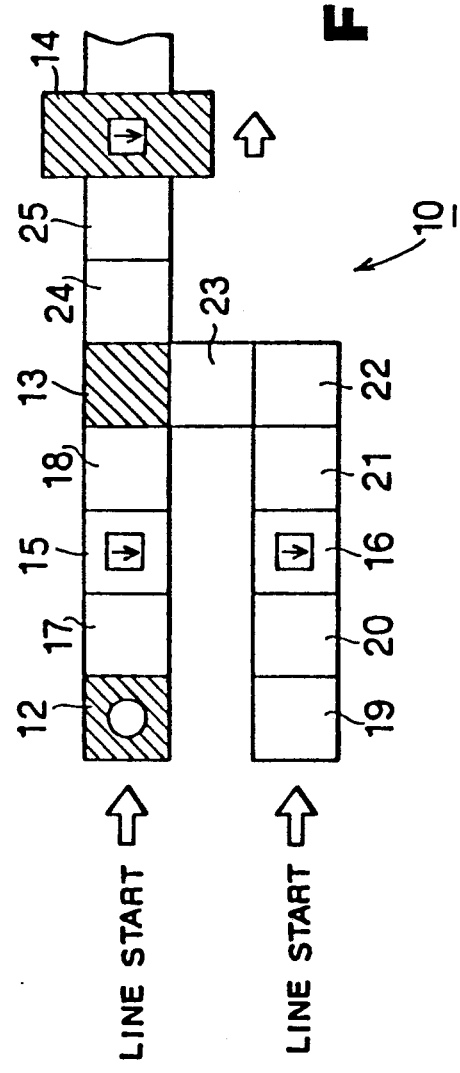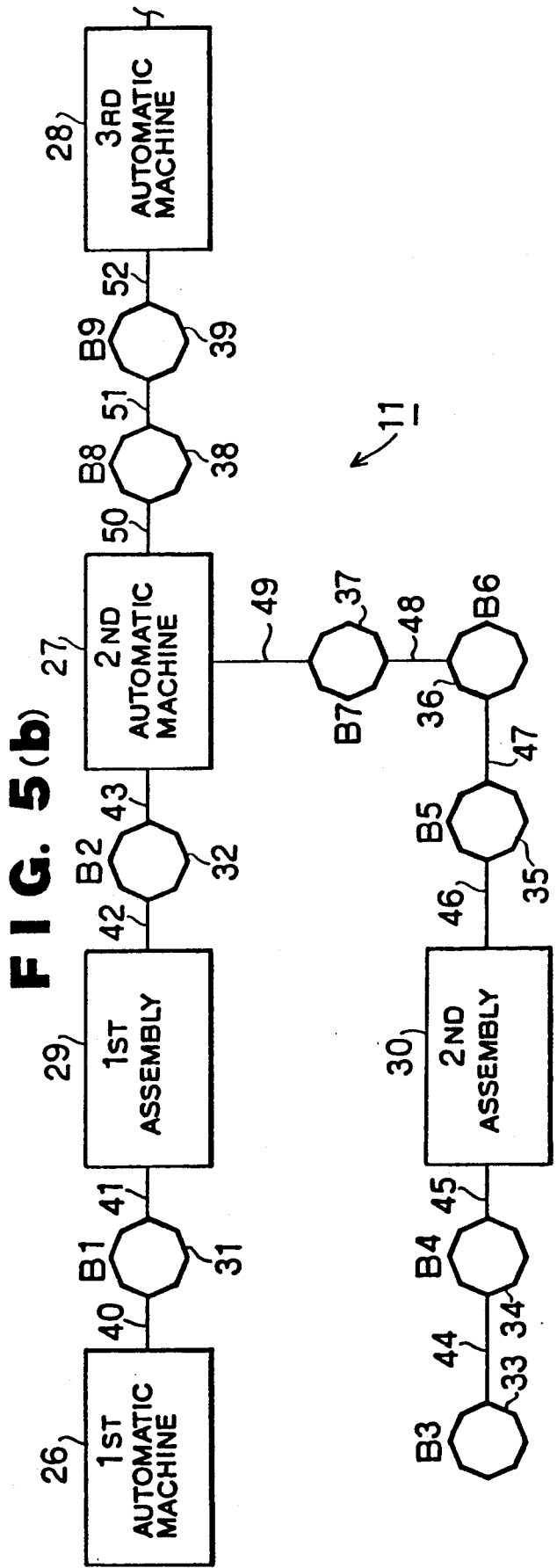
FIG. 5(a)
FIG. 5(b)

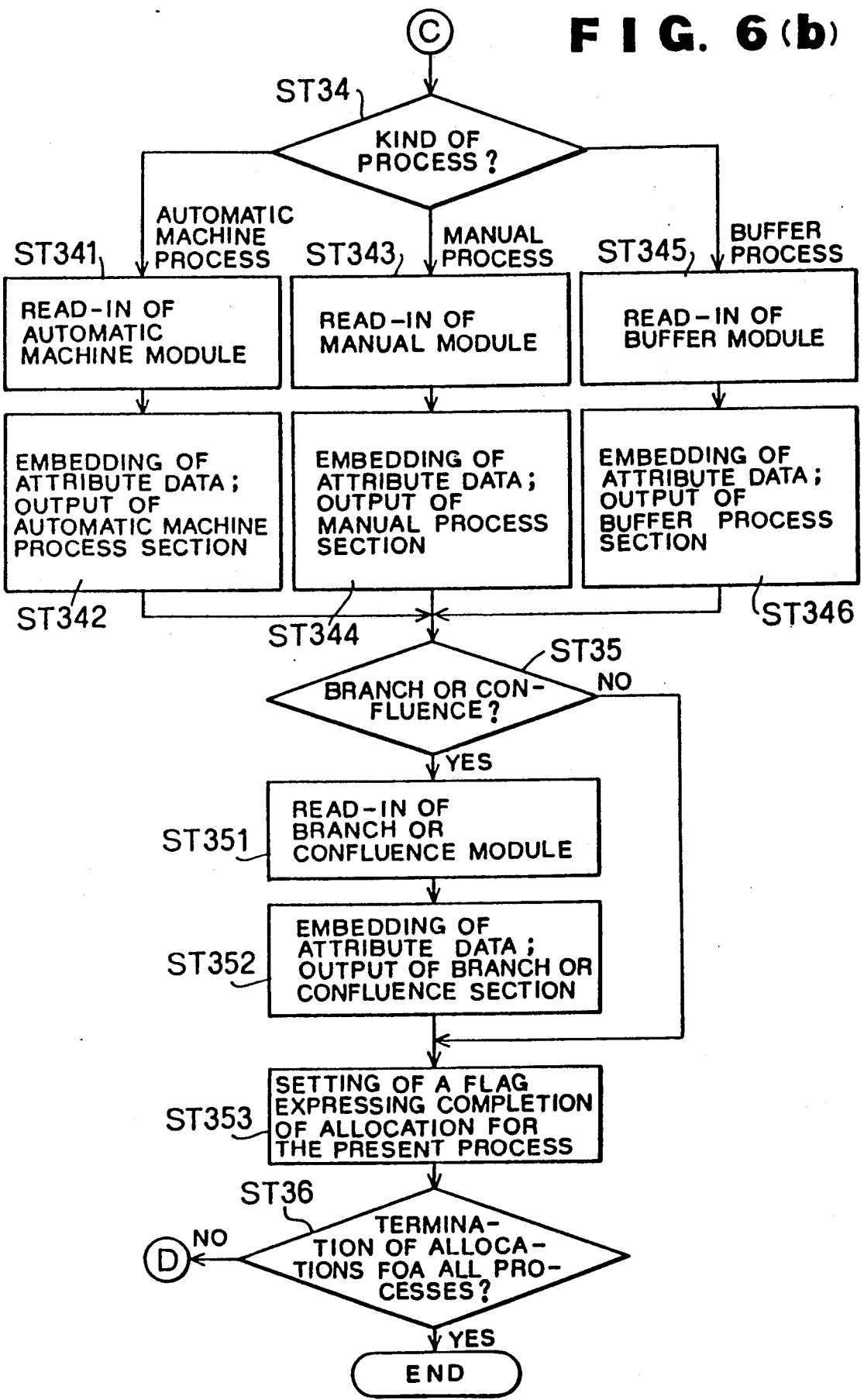

FIG.7

```
————— PARTS CREATE —————

CREATE,*,*,,,1;
    ACT/*,,XX(*).EQ.*,V*;
    ACT/*,,XX(*).EQ.*,W;
    ACT/*,,XX(*).EQ.*,W;
V*  ASSIGN, XX(*)=XX(*)+L*,ATRIB(1)=0,U*=L*+X*,1;
    ACT,,XX(*).LT.U*,U*;
```

GENERATING DEVICE FOR PRODUCTION SYSTEM SIMULATOR

BACKGROUND OF THE INVENTION

1. Field of the Invention

The present invention relates to a generating device for a production system simulator which rapidly, accurately, easily and automatically generates a production system simulator which supports a manufacturing system in design, operation and improvement by evaluating it quantitatively.

2. Description of the Prior Art

Recently, as production systems are getting to be higher degree and more complicated than ever, for the purpose of supporting a production system in design, operation and improvement, a production system simulator which can evaluate the production system quantitatively is more often utilized than before. In the past, the following two methods have been used for the utilization of production system simulators: (1) a method for generating a production system simulator with the use of a general purpose simulation language; (2) a method in which a general purpose production system simulator is used.

In the former case, the expert has to collect the production system parameters necessary for generating a production system simulator by using a general purpose simulation language upon visiting a production site, and every detail is programmed by the expert with the general purpose simulation language to generate a simulator to be exclusively used for the production system. Therefore, there are problems that a simulator cannot be generated without an expert and that the work to generate a simulator is complicated and also requires a long time for completing it.

In the latter case, an expert is not needed but the parameters for modeling a production system are limited to the standard elements provided for the simulator, so that there is a problem that characteristics inherent in individual production system are not evaluated.

SUMMARY OF THE INVENTION

The present invention is directed toward solving the above-mentioned problems, and has two objects as described in the following. One object is that those people who do not have any knowledge of a general purpose simulation language can generate a production system simulator easily, quickly and correctly. The other object is that those people who have the knowledge of a simulation language can generate a production system simulator quickly and accurately, because a simulator described in the general purpose simulation language is automatically generated, and also they can add a function or functions besides those prepared beforehand by a simulator generating device effectively by modifying the generated basic simulator.

To achieve the above-mentioned objects, a generating device for a production system simulator according to the present invention comprises: a production system model input section for inputting, editing and storing the data concerning individual production processes, their locations and the connecting relations among them in an interactive mode using graphic symbols expressing individual processes of an object production system of simulation, and for inputting, editing, storing and outputting the attribute data corresponding to individual processes and the attribute data of the production system; a modularization library storage section for storing element module groups of a simulator described with a general purpose simulation language; a production system simulator generating section which reads the element modules of a simulator corresponding to the data which are input from the production system model input section, from the modularization library storage section and combines them, and also automatically allocates attribute data and numbers of variables to generate and output a production system simulator source program.

The above-mentioned objects, other objects and new features of this invention will be better understood by reading the following detailed description referring to the appended drawings. These drawings are however solely for illustrative purposes and do not limit the scope of the present invention.

BRIEF DESCRIPTION OF THE DRAWINGS

FIG. 2 and FIG. 3 respectively show flow charts for illustrating the operation of a production system model input section 1 in the embodiment according to the present invention and the control operation by users of the present device;

FIG. 4 is a detailed block diagram of the production system model input section 1;

FIG. 5(a) and FIG. 5(b) show an example of a manufacturing system to be an object of simulation, and a display screen when the above-mentioned example is input to a display device 5 with the production system model input section 1;

FIG. 6(a) and 6(b) show a flow chart for illustrating the operation of a production system simulator generating section 3 in the embodiment according to the present invention; and FIG. 7 shows a parts creation module which is an example of a modularization library to be stored in a modularization library storage section 2 in the embodiment according to the present invention.

DETAILED DESCRIPTION OF THE PREFERRED EMBODIMENT

Figure 1:
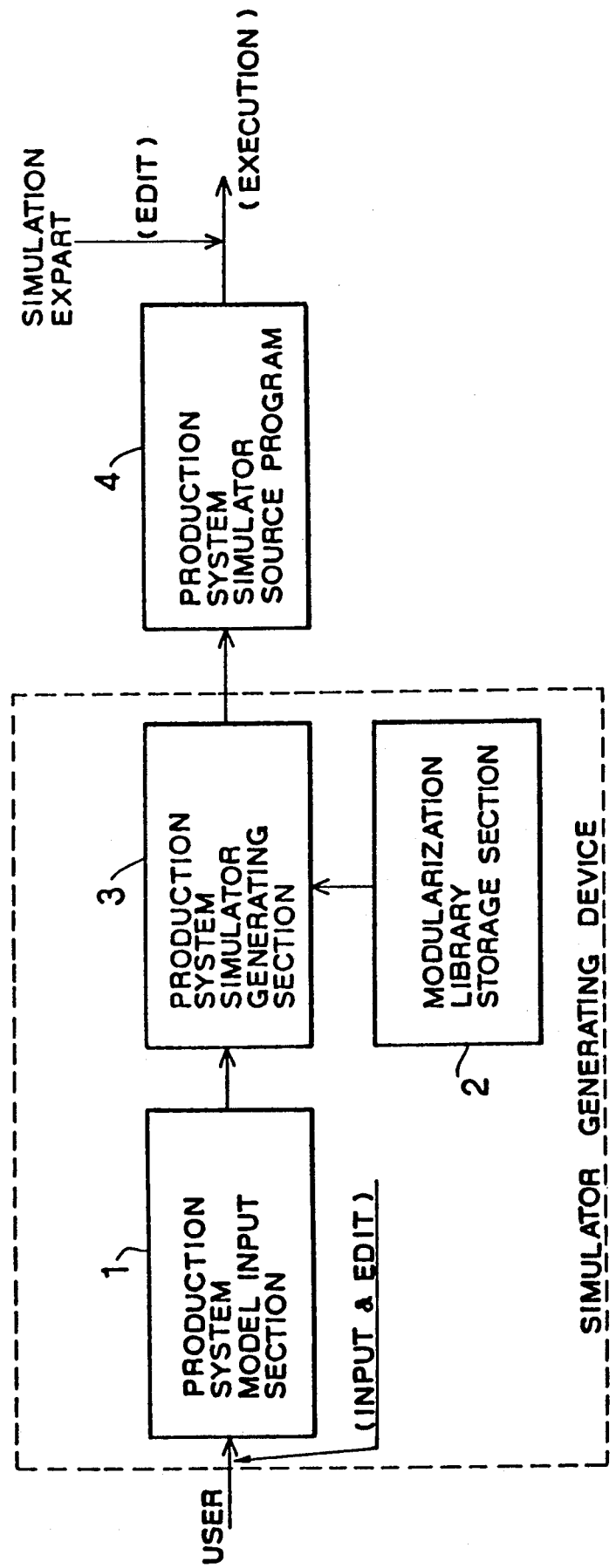
FIG. 1 shows a functional block diagram of a generating device for a production system simulator in an embodiment according to the present invention.
Figure 2:
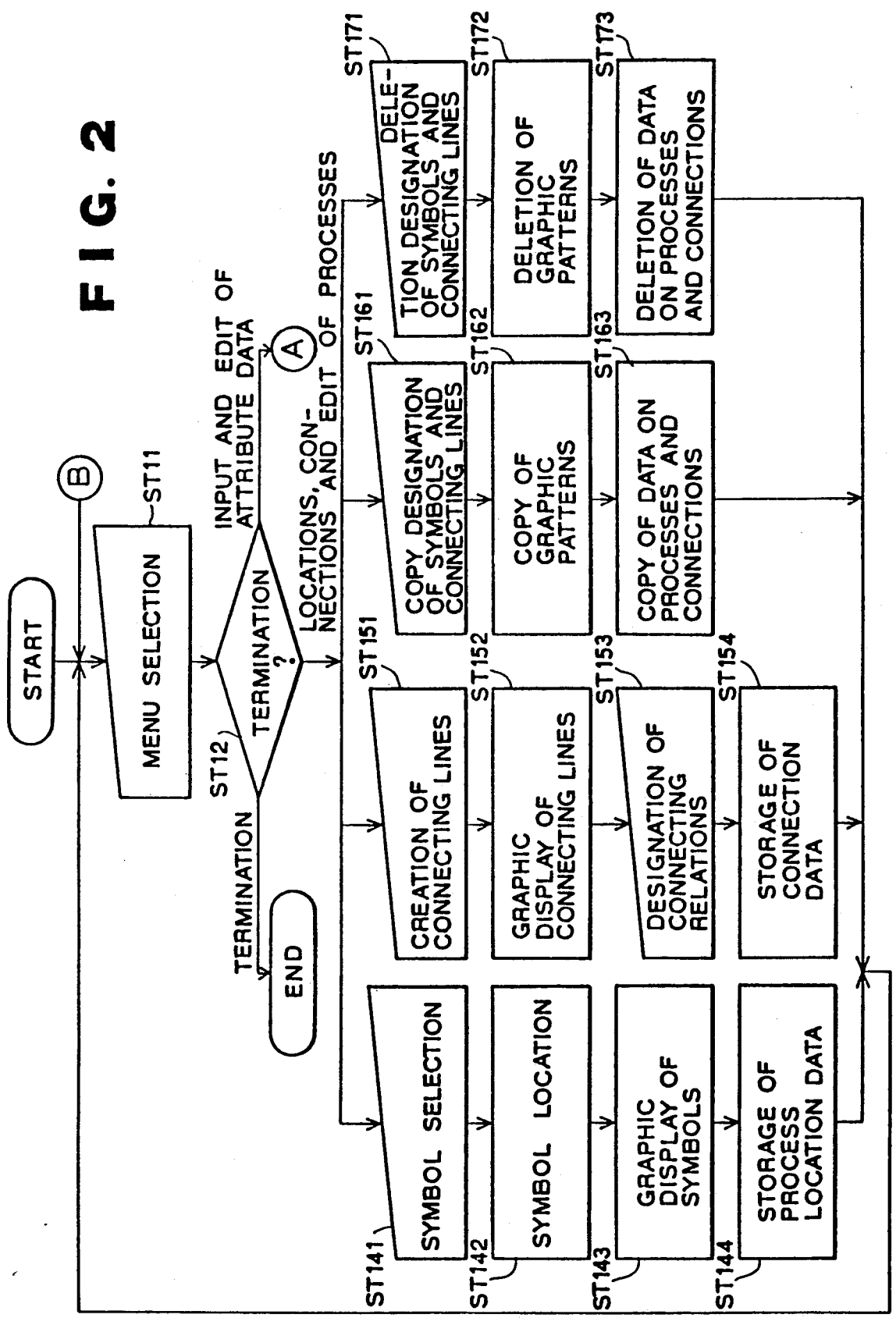

FIG. 1 is a functional block diagram of a generating device for production system simulators according to an embodiment of the present invention. The part surrounded with a broken line shows the function of the present simulator generating device. Reference numeral 1 in the figure is a production system model input section which inputs, edits and stores the data concerning individual production processes, their locations and the connecting relations among them in an interactive mode using graphic symbols expressing three kinds of individual processes such as automatic machine processes, manual processes, buffer processes, and also inputs, edits and stores the attribute data corresponding to individual processes (graphic symbols), (for example, in the case of an automatic machine process: mean time between failures and mean recovery time of failures; in the case of a manual process: the time for assembling and the number of parts to be assembled; in the case of a buffer process: a time for conveyance etc.) and the attribute data of the production system [for example, the conditions of simulation (start or termination)], and outputs these data to a production system simulator generating section 3 which will be described later; reference numeral 2 is a modularization library storage section which stores individual element module groups constituting a simulator which are classified into a parts creation module, a parts erasure module, an automatic machine module, a manual module, a buffer module, a branch and confluence module, a measurement module for storing the quantity of state in the simulation, and which has the function to output these data to the production system simulator generating section 3; reference numeral 3 is a production system simulator generating section which deciphers various input data from the model input section 1, combines corresponding element modules input from the library storage section 2 and automatically generates and outputs a production system simulator source program 4. FIG. 2 and FIG. 3 are the flow charts for illustrating the operation of the production system model input section 1 of the generating device for production system simulators according to the embodiment of the present invention and for illustrating the control operation of users of the present device. FIG. 4 shows a detailed block diagram of the production system model input section 1. In the figure, reference numeral 5 is a display device; 6 is a keyboard device; 7 is a mouse; 8 is a storage device; 9 is a control device for controlling the operations of the display device 5 through the storage device 8. FIG. 5 shows an example of a production system to be a simulation object, and an example of a display screen of the display device 5 when the above data are input from the manufacturing system model input section 1 to the display device 5. In FIG. 5(a), reference numeral 10 is an example of a production system, reference numerals 12, 13 and 14 are automatic machine processes, 15 and 16 are manual processes, and 17 to 25 are buffer processes. In FIG. 5(b), reference numeral 11 is a display screen corresponding to the production system example 10, reference numerals 26, 27 and 28 are graphic symbols expressing automatic machine processes, 29 and 30 are graphic symbols expressing manual processes, and 31 to 39 are graphic symbols expressing buffer processes; 40 to 52 are connection lines expressing the connections between graphic symbols.

In FIG. 1 to FIG. 5, the model input section 1 displays a menu on the display device 5, which menu the users of the present device use for the selection of operation. When a user designates a desired operation with a mouse 7, the model input section 1 selects one of the following 6 cases corresponding to the designation.

(1) When the locations of processes are selected:

The model input section 1 displays a menu of three kinds of processes, an automatic machine process, a manual process and a buffer process, in the display device 5. A user designates a process which he wants to locate with a mouse 7 out of the displayed processes (in step ST141 in FIG. 2), and designates the location of the graphic symbol on the display device 5 with a mouse 7 (in step ST142). For example in FIG. 5, processes and locations of automatic machine symbols 26 to 28 shown in the display screen 11 show a system example in which automatic machines 12 to 14 shown in the production system example 10 are located respectively (in step ST143). Similar correspondence is seen on manual processes and buffer processes. When the processes are located, the model input section 1 stores the data on the located processes and the locations (positions) in the storage 8 (in step ST144).

(2) When the connections of processes are selected:

The model input section 1 requests the user to create connecting lines for connecting processes and to designate processes to be connected on the display device 5 (in steps ST151 – ST153). After these requests are executed by the user, the model input section 1 stores the data on designated matters by the user in the storage 8 (in step ST154). In FIG. 5, a connecting line 40 connects an automatic machine symbol 26 and a buffer symbol 31. Other connecting lines 41 to 52 work in similar ways.

(3) When copying is selected:

The model input section 1 requests to designate a process to be copied and the connecting relations; when the requests are executed by the user with a mouse 7 on the display device 5 (in step ST161), the model input section 1 at first copies the graphic patterns of the symbols and connecting lines on the display device 5 (in step ST162), and then stores the data on the copied, newly edited processes, locations and connections in the storage 8 (in step ST163).

(4) When deletion is selected:

The model input section 1 requests to designate the processes and connecting relations to be deleted; on the execution of the requests by the user on the display device 5 with a mouse 7 (in step ST171), the model input section 1 at first deletes the designated graphic patterns of the symbols and connections on the display device 5 (in step ST172) and then deletes and edits the data on the corresponding processes, locations and connections from the storage device 8 (in step ST173).

(5) When input of attribute data is selected:

When the user designates a process to which attribute data are to be input on the display device 5 with a mouse 7 (in step ST181 in FIG. 3), the model input section 1 displays an input request of the attribute data items of the process and the production system on the display device 5. When the user inputs the data from the keyboard device 6 (in step ST182), the model input section 1 stores the data in the storage 8 (in step ST183).

(6) When edition of attribute data is selected:

When the user designate a process for editing the attribute data on the display device 5 with a mouse 7 (in step ST191), the model input section 1 displays an input requirement of the modification data on the attribute data items of the process and the production system on the display device 5. When the user inputs the data from the keyboard device 6 (in step ST192), the model input section 1 replaces the old data with the new ones and edits them (in step ST193).

Figure 6A:
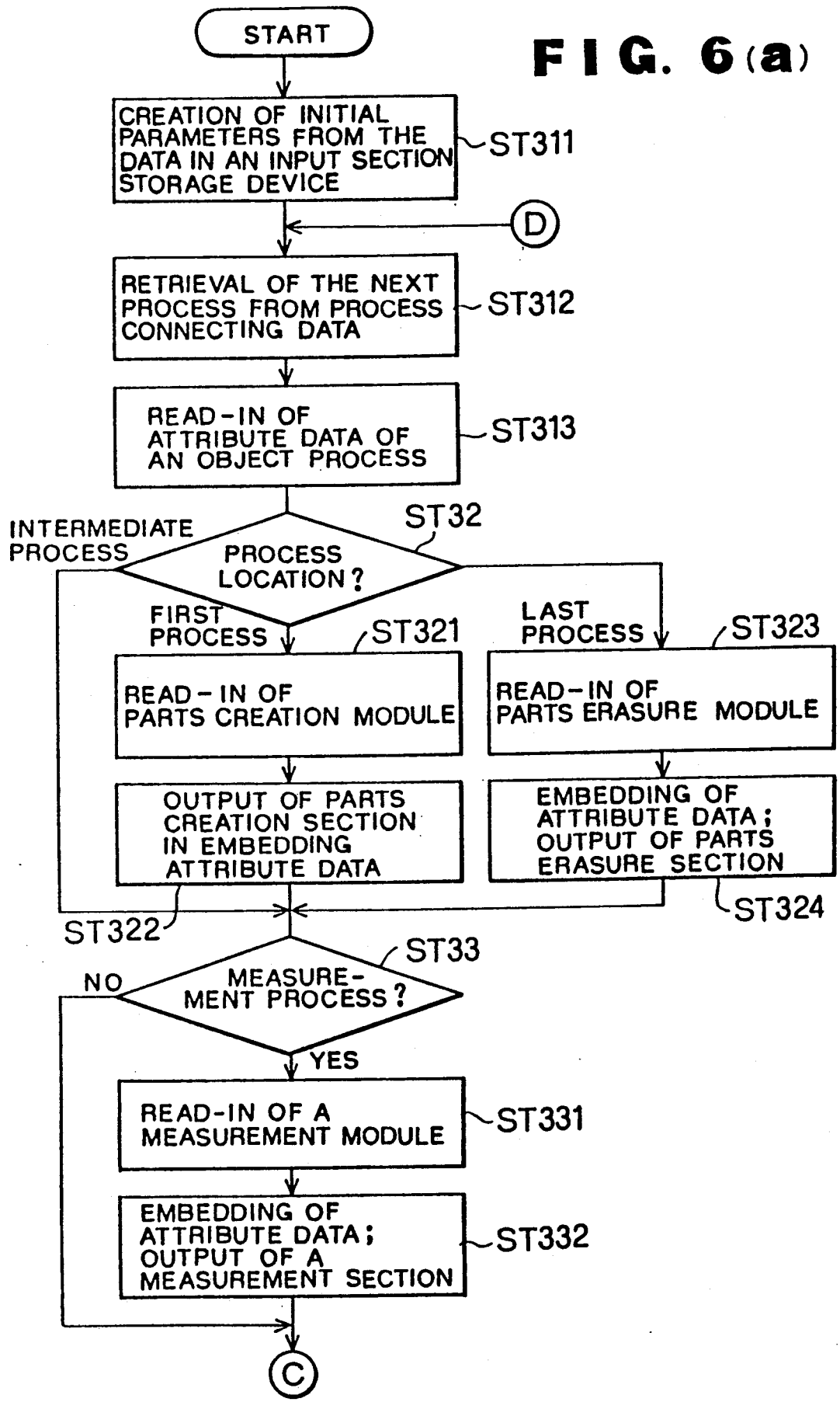

FIG. 6 is a flow chart for illustrating the operation of the production system simulator generating section 3 in the generating device for a production system simulator according to the embodiment of the present invention; FIG. 7 shows a parts creation module written in a general purpose simulation language, which is an example of a modularization library in the modularization library storage section 2. Element module groups (soft program) of a simulator written in the general purpose simulation language which comprises a parts creation module, a parts erasure module, an automatic machine module, a manual module, a buffer module, a branch and confluence module, a measurement module, etc., are stored in the modularization library storage section 2.

At first, in step ST311 in FIG. 6, the production system simulator generating section 3 creates and outputs initial parameters such as simulation conditions (start, termination) or dimensions of variable arrays.

The simulation conditions (start, termination) are created and output based on the production system attribute data stored in the storage device 8 in the production system model input section 1, and the dimensions of variable arrays are created and output based on the number of attribute data corresponding to individual processes stored in the storage device 8. In step ST312, the next process of the present object process is retrieved based on the data on the processes, locations and connections in the storage device 8. If there is no previous process of the present object process, it is selected as a first process. In step ST313, the attribute data of the object process are read from the storage device 8. In step ST32, the object process is decided to be one of a first process, an intermediate process and a last process. When the object process is the first process, a parts creation module (shown in FIG. 7) is read from the modularization library storage section 2 in step ST321, and a numerical value is automatically selected and substituted for an asterisk * (shown in FIG. 7) which shows a position to be input the attribute data and the number of the variable based on the attribute data read in the previous step, and successively creates and outputs a parts creation section of a source program 4 (in step ST322). When the present object process is the last process (when there is no following process to the present object process), a parts erasure module is read (in step ST323) to create and output a parts erasure section of the source program 4 in the similar way.

In step ST33, the type of the present object process is determined based on the attribute data read from the storage device 8, and if it is judged to be a measurement process, a measurement module is read from the modularization library storage section 2 (in step ST331), and creates and outputs a measurement section of the source program 4 inserting numerical values and the numbers of variables into the part of variables of a module corresponding to the input attribute data and the variables number input sections (in step ST332). In the similar way, in step ST34, the present object process is judged to be an automatic machine process, a manual process or a buffer process, and a corresponding module is read from the modularization library storage section 2 (in each of steps ST341, ST343 and ST345), and creates and outputs the source program 4 (in steps ST342, ST344 and ST346, respectively).

In step ST35, the type of the present object process is judged based on the attribute data read from the storage device 8, and if it is a branch and confluence process, a corresponding module is read from the modularization library storage section 2 (in step ST351), and similarly to the above case, creates and outputs the source program 4 (in step ST352).

In the step ST353, when the creation and output of the program concerning the present object process is finished, a flag expressing the finish of allocation is set to the present process. Until the allocation of all the processes in the storage device 8 is finished, the above-mentioned series of processing operations are repeated and the simulation source program of an input production system is created and output (in step ST36).

In the above-mentioned embodiment, there being described the case where a production system model input section 1 has both functions: a function of inputting, editing and storing the data on individual processes, their locations and their connecting relations in a production system, and a function of inputting, editing and storing the attribute data of individual processes and the attribute data of the production system; the same effect however can be obtained with two input sections allocating each of the above-mentioned functions to each of the input sections.

In the above-mentioned embodiment, there being described an example in which a mouse is applied to a production system model input section 1, other devices or methods which can designate a position on a display picture can be used.

In the above-mentioned embodiment, the modularization library in the modularization library storage section 2 is limited to a parts creation module, a parts erasure module, an automatic machine module, a manual module, a buffer module, a branch and confluence module and a measurement module, but if necessary other modules can be added.

In the above-mentioned embodiment, the graphic symbols in the production system model input section 1 are limited to three kinds of processes, an automatic machine process, a manual process and a buffer process, but besides these processes, for example, a conveyance process can be added, and also corresponding to the features of an object production system a plurality of necessary processes can be defined.

Furthermore in the above-mentioned embodiment as shown in FIG. 7, the explanation is based upon specifying a certain general purpose simulation language, but other general purpose simulation languages can be used with similar effect.

As described in the above, a generating device for a production system simulator according to the present invention comprises: a production system model input section which inputs, edits and stores the data on individual processes, their locations and their connecting relations in an interactive mode by using the symbols expressing individual processes in a simulation object production system, and also inputs, edits, stores and outputs the data on the attribute data corresponding to individual processes and the attribute data on the production system; a modularization library storage section for storing simulator element module groups described with a widely used simulation language; and a production system simulator generating section which reads simulator element modules corresponding to the input data to the production system model input section from the modularization library storage section, and at the same time it automatically performs the allocation of the attribute data and the numbers of variables and creates and outputs a production system simulator source program; therefore it is made possible to input parameters in an interactive mode using graphic symbols with the production system model input section. Since automatic generation of a production system simulator is made possible by the simulator generating section, those people who do not know any general purpose simulation language can perform a production system simulator generating work effectively in a short time.

Furthermore, a production system simulator which is automatically generated is written in a general purpose simulation language, so that an expert in simulation can effectively add a function or functions besides those prepared in advance by the simulator generating device.

What is claimed is:

1. A generating device for a production system simulator comprising: a production system model input means for inputting, editing and storing data on individual processes and connecting relations among them in a production system as a simulation object in an interactive mode using graphic symbols expressing individual processes in the production system having 3 types of processes such as an automatic machine process, a manual process and a buffer process, and for inputting, editing, storing and outputting attribute data corresponding to said individual processes and attribute data of the production system; a modularization library storage means for storing simulator element module groups written in a genera purpose simulation language, said simulator element module groups being constituted of a parts creation module, a parts erasure module, an automatic machine module, a manual module, a buffer module, a branch and confluence module, and a measurement module; and a production system simulator generating means for reading out the simulator element modules corresponding to the data which are input from said production system model input means, from said modularization library storing means, for combining them, for performing automatic allocation of said attribute data, and for creating and outputting a production system simulator source program.

2. A generating device for a production system simulator comprising: a production model input means for inputting, editing and storing data on individual processes in a production system as a simulation object and connecting relations among them in an interactive mode using graphic symbols expressing individual processes in the production system, and for inputting, editing, storing and outputting attribute data corresponding to said individual processes and attribute data of the production system; a modularization library storage means for storing simulator element module groups written in a general purpose simulation language; and a production system simulator generating means for reading out the simulator element modules corresponding to the data which are input from said production model input means, from the modularization library storage means, for combining them, for performing automatic allocation of the attribute data, and for creating and outputting a production system simulator source program.

* * * * *